United States Patent [19]

Spilsbury

[11] 4,297,621

[45] Oct. 27, 1981

[54] CATHODE RAY TUBE BEAM DEFLECTION AMPLIFIER SYSTEM

[75] Inventor: Thomas W. Spilsbury, Phoenix, Ariz.

[73] Assignee: Sperry Corporation, New York, N.Y.

[21] Appl. No.: 193,236

[22] Filed: Oct. 2, 1980

[51] Int. Cl.³ .................... H01J 29/70; H01J 29/76
[52] U.S. Cl. .................................. 315/397; 315/403
[58] Field of Search ................... 315/396, 397, 403

[56] References Cited

U.S. PATENT DOCUMENTS 3,816,792  6/1974  Spencer, Jr. .................... 315/395

Primary Examiner—Theodore M. Blum

Attorney, Agent, or Firm—Howard P. Terry; Terry J. Ilardi

[57] ABSTRACT

A cathode ray dual mode electromagnetic beam deflection amplifier system for providing current for driving a deflection coil, and means for switching between linear and resonant non-linear operational modes. In the linear mode, the deflection coil current is controlled to closely follow an applied input deflection sweep voltage and operates as a push-pull amplifier. In the non-linear resonant mode, one-half the output stage is abruptly decoupled from the deflection coil such that energy stored in the deflection coil is discharged into a series capacitor, the subsequent resonant pulse being returned through the non-decoupled half of the output stage to a power supply.

6 Claims, 6 Drawing Figures

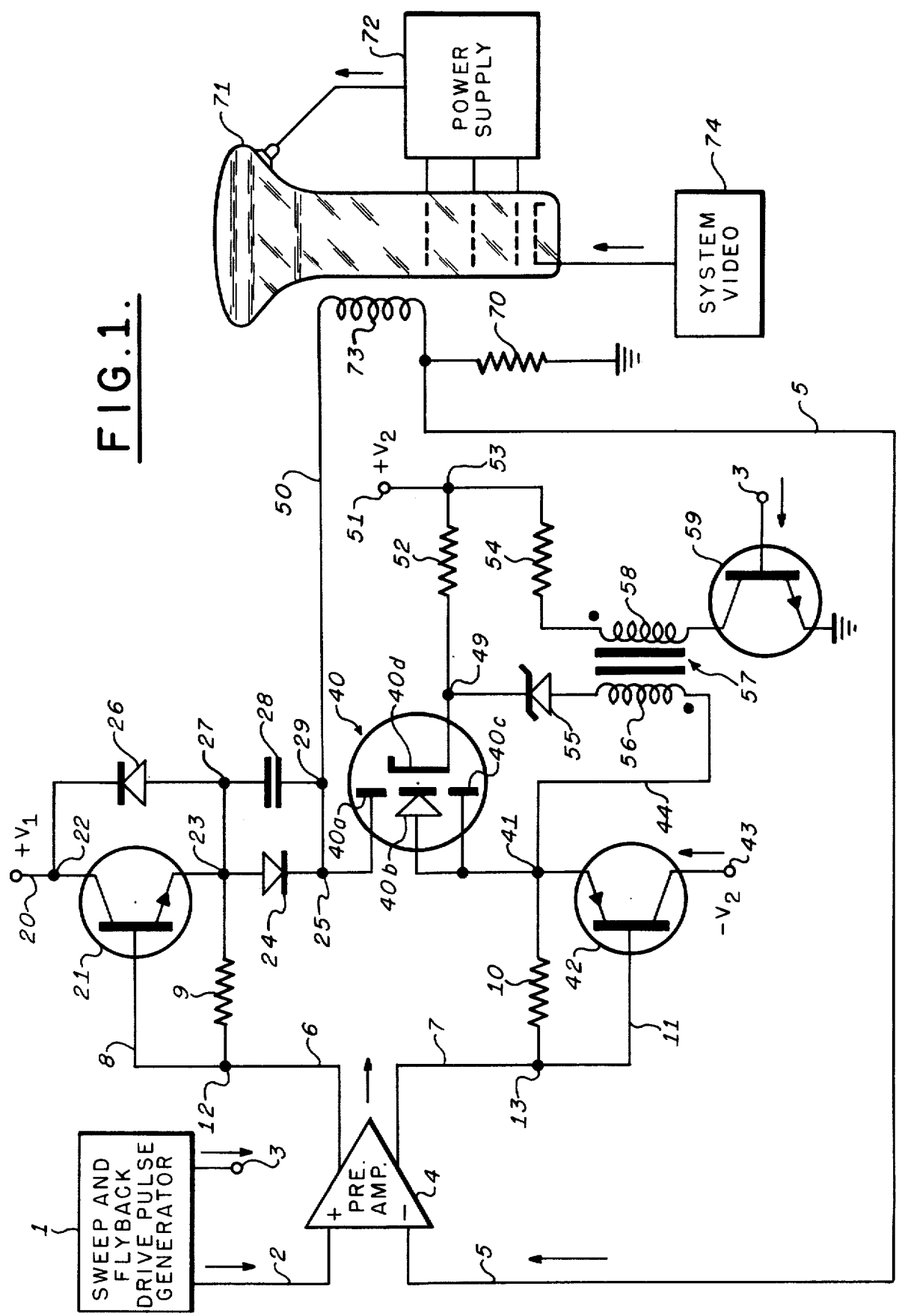

CATHODE RAY TUBE BEAM DEFLECTION AMPLIFIER SYSTEM

BACKGROUND OF THE INVENTION

1. Field of the Invention

The invention relates to cathode ray beam deflection systems and more particularly to beam deflection amplifier systems employed in electromagnetic deflection systems.

2. Description of the Prior Art

One prior art deflection amplifier system of interest with respect to the present invention is disclosed in the J. M. Spencer U.S. Pat. No. 3,816,792 for a "Cathode Ray Tube High Speed Electromagnetic Deflection System", issued June 11, 1974, and assigned to Sperry Corporation. Spencer describes a deflection system including a differential input amplifier stage and a push-pull current controlling output stage which drives the deflection coil of the display system. A sampling resistor is connected in series with the beam deflection coil to provide a negative feed back voltage proportional to coil current for use in promoting linear operation of the system. One terminal of a capacitor is connected to the end of the beam deflection coil coupled to the input amplifier output terminal, while the other terminal of the capacitor is connected through a bidirectional switch to a potential source. The bidirectional switch consists of a transistor and a diode connected in parallel, each constituting a respective half of the switch and operative in respective halves of the cycle of resonant oscillation which occurs during the resonant retrace interval. When the deflection amplifier system is operating in the linear mode, the bidirectional switch is non-conducting and, therefore, the capacitor is effectively disconnected from the deflection coil. In the non-linear mode, the bidirectional switch functions to connect the capacitor conductively with the beam deflection coil; simultaneously, a second switch effectively disconnects, the coil-capacitor circuit from the input amplifier, whereby resonant current flow occurs between the beam deflection coil and the capacitor to effect the desired rapid, energy saving retrace. Other prior art of interest is discussed in the H. C. Hilburn U.S. Pat. No. 3,786,303 for a "Cathode Ray Tube Dual Mode Horizontal Deflection Control Amplifier", issued Jan. 15, 1974 and also assigned to Sperry Corporation. These prior art configurations, though they accomplish their objectives in an entirely satisfactory manner, have a common limiting defect, in that the fly-back capacitor shunts the deflection coil. This fact limits the operating band width of the circuit, increases the level of power dissipation, and increases the chances of unstable operation. While the arrangement of U.S. Pat. No. 3,816,792 did advantageously switch the fly-back capacitor out of the circuit cyclically, complexity and parts count were undesirably increased. Of course, the shunting effect of the capacitor was not fully removed.

SUMMARY OF THE INVENTION

The present invention provides an efficient and a compact cathode ray beam deflection coil excitation system of simplified nature. Like the aforementioned Spencer circuit, a preamplifier stage is provided along with a current amplifying output stage which applies excitation of the beam deflection coil. In the invention, the flyback system is now integrated directly within the current amplifier stage. As will be further described, when operating in the non-linear resonant mode, a portion of that stage that is conducting current to the deflection coil will be abruptly decoupled from the deflection coil via a switch, such that the energy stored within the deflection coil will resonantly discharge through a serial connected capacitor to a power supply being used to return the fly-back current, thereby reducing the number of parts and improving performance with respect to the prior art. This integration also provides a hybrid deflection control system capable of both raster or stroke presentation.

BRIEF DESCRIPTION OF THE DRAWINGS

FIG. 1 is a wiring diagram of the invention showing its electrical components and their interconnections.

DESCRIPTION OF THE PREFERRED EMBODIMENTS

FIG. 1 presents details of the novel cathode ray deflection amplifier for driving a corresponding deflection coil 73 of a cathode ray display tube 71. Cathode ray tube 71 is supplied in the usual manner from a suitable anode voltage power supply 72. Display tube 71 includes a cathode which may be fed with video signals from video source 74. Power supply 72 is additionally arranged to activate at least one prefocussing or control grid and a focussing electrode, in the usual manner.

Figure 2A:
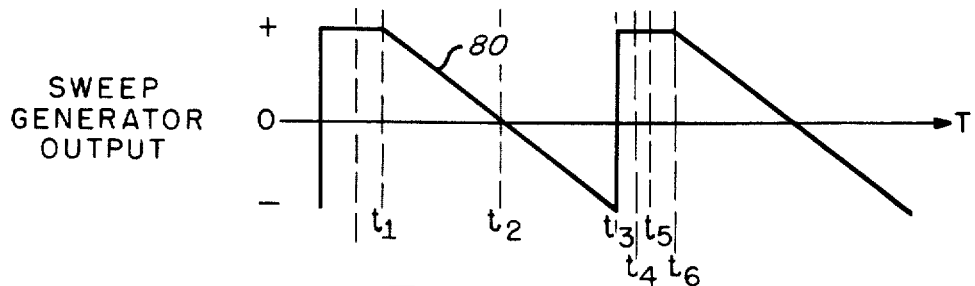
FIGS. 2a through 2e are graphs useful in explaining the operation of the invention.
Figure 2B:
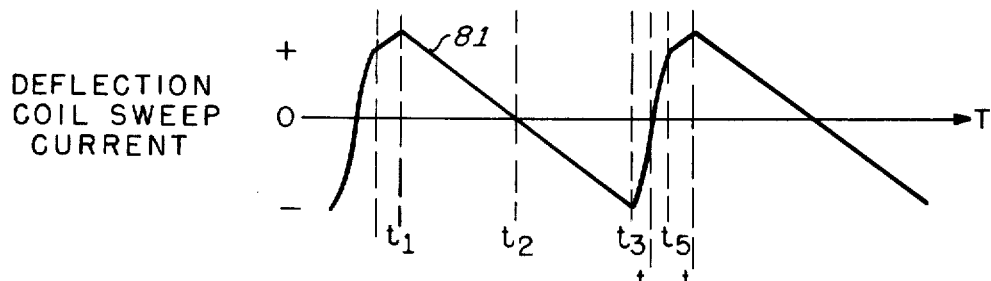
Figure 2C:
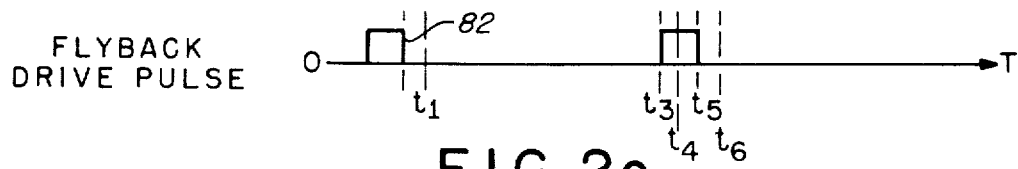
Figure 2D:
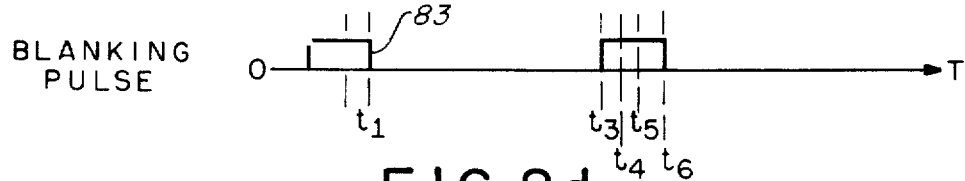

A deflection sweep wave generator 1 containing an internal fly-back drive pulse generator supplies the sweep wave voltage 80 of FIG. 2a via lead 2 to one input of a differential preamplifier 4, and fly-back drive synchronizing pulses such as those at 82 of FIG. 2c, which control the timing of sweep wave 80 and appear at terminal 3 for timing the operation of transistor 59. The sweep generator 1 may also supply the electron beam blanking pulses 83 of FIG. 2d for blanking the flow of beam current in the time $t_3$ to $t_6$ indicated in FIG. 2d when it is desired to prevent the beam from writing on the cathode ray tube phosphor. It will be understood that power supply 72 and apparatus for forming the blanking pulses form no essential part of the present invention so that they need not be dealt with in detail herein.

One end of deflection coil 73 is coupled to ground through a current sampling resistor 70; resistor 70 provides a voltage proportional to current flowing through deflection coil 73, which voltage is fed back as a negative feed back signal via lead 5 to a second input of preamplifier 4, the inputs on leads 2 and 5 being poled as shown in FIG. 1.

A first output terminal of preamplifier 4 is coupled via lead 6 to junction 12, where there is found a branching circuit from junction 12 via lead 8 to the base of transistor 21 and from junction 12 through resistor 9 to junction 23 and thence to the emitter of transistor 21. The collector of transistor 21 is coupled through junction 22 to voltage source $+V_1$ at terminal 20. Diode 26 is connected between junction 22 and junction 27 to junction 23. Connections are also made from junctions 23 and 27 by diode 24, which will be referred to as the fly-back diode, and junction 25 and by the capacitor 28, which will be referred to as the fly-back capacitor, and junction 29 to lead 50 for supply of deflection current to coil 73.

A second output terminal of preamplifier 4, is coupled by lead 7 to junction 3, where there is found a branching circuit between junction 13 via lead 11 to the base of transistor 42 and from junction 13 through resistor 10 to junction 41 and thence to the emitter of transistor 42. The collector of transistor 42 is coupled to a source at terminal 43 of voltage $-V_2$.

Junction 41 is coupled to the source electrode 40c of a field effect transistor 40 and also to its substrate electrode 40b, while junction 25 is coupled to the drain electrode 40a thereof. The gate electrode 40d of transistor 40 is connected through junction 49, resistor 52, and junction 53 to a source of voltage $+V_2$ at terminal 51. Transistor 40 is of the n-channel, metal-oxide-semiconductor field effect type. It is a temperature stable, enhancement mode, metal-oxide-semiconductor field effect transistor (MOSFET), having the source tied to the substrate, and is obtainable, for example, from International Rectifier's Semiconductor Division, 233 Kansas Street, El Segundo, Calif. 90245.

The gate electrode 40a of transistor 40 is also connected through terminal 49, Zener diode 55, a first winding 56 of a transformer 57 (poled as shown), and lead 44 to the terminal 41 of the emitter of transistor 42. The circuit is completed through resistor 52, junction 53, resistor 54, and the second transformer winding 58 (poled as shown). As noted, fly-back drive pulses applied to terminal 3 from sweep and fly-back drive pulse generator 1 are supplied to the base terminal of transistor 59 which is coupled to terminal 3; the collector of transistor 59 is coupled to the end of winding 58 opposite resistor 54, while its emitter is grounded.

During the cathode ray beam sweep time $t_1$ to $t_3$ of wave 80 of FIG. 2a, transistor 59 is held non-conducting by the absence of fly-back drive pulse 82 of FIG. 2c on terminal 3. Transistor 40, however, is biased into its conducting state by the positive gate-to-source electrode voltage which consequently develops across Zener diode 55, due to the small bias current flowing from the $+V_2$ voltage source at terminal 51 through resistor 52, Zener diode 55, transformer secondary 58, and transistor 42, to the $-V_2$ power supply terminal 43. The secondary 58 of pulse transformer 57 behaves as a d.c. short circuit. As long as transistor 40 conducts, the invention operates as a conventional linear, or stroke, push-pull amplifier. The effects of the forward voltage drop across fly-back diode 24 and transistor 59 are adjusted for in a conventional manner by setting up appropriate bias voltages in the output stage of preamplifier 4, the output signals therefrom being in phase but displaced from each other by the aforesaid bias voltages. As a result, a minimum of cross-over distortion occurs at the output 50 of the amplifier system.

At the start of time $t_1$, waveform 80 is positive with respect to ground, and transistor 21 will be on, amplifying the sweep signal received from the preamp 4 via lead 6, and permitting current to flow from the $+V_1$ power supply at terminal 20, through transistor 21, diode 24, deflection coil 73 and resistor 70 to ground. Transistor 42 is biased to conduct current when the sweep generator output signal received from the preamp via lead 7 approaches zero volts at time $t_2$, from the $-V_2$ power supply at terminal 43, through transistor 40, deflection coil 73, and resistor 70, to ground.

At the start of the fly-back time $t_3$, deflection current is flowing through transistor 42. Transistor 59 is made to conduct by a fly-back drive pulse applied at terminal 3 to its base electrode. The conduction of transistor 59 causes a voltage drop across the primary winding 58 of transformer 57 so that a corresponding rapid voltage change obtains across the transformer winding 56. This latter impulse pulls the gate-to-source voltage of transistor 40 negative causing it to become reverse biased, abruptly ending conduction therein. In this manner, the current path of the deflection wave 81 changes at time $t_3$ and a new current path is used. The current in coil 73 can no longer flow through transistor 42, and instead flows throgh fly-back capacitor 28 and diode 26 into the supply of $+V_1$ voltage at terminal 20.

The sudden change in current generates a positive voltage pulse according to the equation:

$$V = L(di)/(dt)$$

where

L = the deflection coil inductance,
V = the voltage on the coil,
di/dt = the change in deflection coil current with time.

Figure 2E:
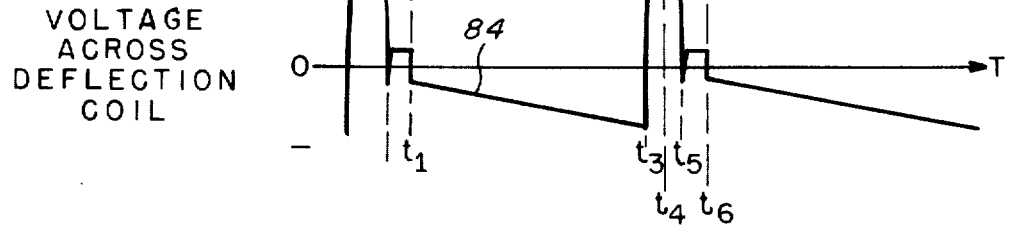

Consequently, a half cycle 85 (FIG. 2e) of a resonant sinusoidal oscillation is initiated in the effective inductance of deflection coil 73 together with the capacitance of fly-back capacitor 28, and appears as a fly-back pulse on lead 50.

As the current shown by waveform 81 in FIG. 2B flows through deflection coil 73, it will decrease in amplitude from the negative maximum reached at time $t_3$, until it falls to zero volts at time $t_4$, in correspondence with the fly-back pulse 85 peak, and reverses, thereby becoming positive. Reverse current will now flow from the $+V_1$ power supply at terminal 20 and through the transistor 21 and the fly-back capacitor 28 until the voltage across capacitor 28 rises to a point where it will forward bias diode 24 into conduction. Diode 24 thus acts as a clamping diode and prevents the current from ringing negatively. At this time, $t_5$, transistor 59 is turned off by the ending of pulse 82 and transistor 40 is again biased into conduction. The operation of the invention becomes linear again, comparing the inputs on leads 2 and 5 to correct for any error between the voltage at the input of preamplifier 4 on lead 2 and across the sampling resistor 70 in the manner of a conventional amplifier using negative feed back. As long as transistor 40 remains conducting, the invention behaves as a linear or stroke type of amplifier. Thus, the invention desirably operates to convert the input drive voltage on lead 2 to a proportional current flowing through deflection coil 73.

It is seen that the invention provides a simplified electron beam deflection control system of compact nature which permits hybrid operation with a reduced number of parts. The fly-back capacitor 28 does not shunt the yoke inductance 73 during linear operation so that operating bandwidth is increased and the cathode ray trace is sharper. The fly-back capacitor 28 is also desirably not switched in and out of circuit thus not requiring the additional switching circuits of the prior art. Furthermore, stability is improved because the fly-back capacitor 28 is no longer grounded, eliminating the potential of a typical emitter-follower parasitic oscillation problem. Quicker recovery after the fly-back interval is achieved without the use of appreciably higher power.

While the invention has been described in its preferred embodiments, it is to be understood that the words which have been used are words of description rather than of limitation and that changes within the purview of the appended claims may be made without departing from the true scope and spirit of the invention in its broader aspects.

I claim:

1. A cathode ray tube electron beam deflection control system having linear and non-linear operating modes, comprising:

deflection coil means;

preamplifier means having an input terminal and first and second output terminals, said input terminal responsive to an input sweep signal during said linear mode of operation;

first amplifier means having input and output terminals, said input terminal being coupled to said first output terminal of said preamplifier, for amplifying the current received therefrom;

second amplifier means having input and output terminals, said input terminal being coupled to said second output terminal of said preamplifier, for amplifying the current received therefrom;

fly-back diode means having first and second terminals, said first terminal coupled to said amplifier output terminal for unidirectionally conducting current received from said amplifier output terminal to said flyback diode second terminal;

diode means having first and second terminals, said first terminal coupled to a first power supply having a first voltage potential and said second terminal coupled to said second amplifier output terminal, for unidirectionally coupling current to said first power supply from said diode means second terminal fly-back capacitor means coupled in series relationship with said diode means and in shunt relationship with said fly-back diode means and further coupled to said deflection coil; and switcing means responsive to an applied fly-back drive signal for coupling said second amplifier output terminal with said fly-back diode means second terminal in said linear mode of operation and for decoupling said second amplifier output terminal with said fly-back diode means in said non-linear mode of operation.

2. The apparatus according to claim 1 wherein said first amplifier means comprises a first transistor having a base coupled to said first output terminal of said preamplifier means, a collector coupled to said first voltage supply means, and an emitter coupled to said first terminal of said fly-back diode means; and said second amplifier comprises a transistor having a base coupled to said second output of said preamplifier, an emitter coupled to said switching means and a collector coupled to a second voltage supply.

3. The apparatus according to claim 1 wherein said switching means comprises:

a third transistor having a source, drain, and gate, said source being coupled to said output of said second amplifier, and said drain being coupled to said second terminal of said fly-back diode;

a transformer having primary and secondary windings;

a first series circuit coupled between said gate and source of said third transistor comprising a Zener diode and said secondary winding of said transformer;

a resistor coupled between the junction of said third transistor gate and said Zener diode and a third power supply;

a second series circuit coupled between said third power supply and a ground terminal comprising a fourth transistor having its emitter coupled to said ground terminal, its collector coupled to said transformer primary winding, and its base coupled to receive said fly-back drive pulses, whereby said third transistor means will substantially cease conduction in response to said fly-back drive pulses applied to said fourth transistor means.

4. The apparatus of claim 3 wherein said second series circuit further comprises a resistor coupled between said transformer secondary and said third power supply.

5. The apparatus according to claim 1 wherein said preamplifier means comprises a differential amplifier having first and second inputs, said first input being responsive to said sweep signal;

and further comprising an impedance connected in series with said deflection coil for providing a voltage representative of the current flowing therethrough to be fed back to said second input of said differential amplifier for comparison with said input signal to derive an error signal equal to the difference between the input and feed back signals for controlling the current supplied by said amplifying means in said linear mode.

6. The apparatus according to claim 2 in which said first and second transistors are selected to be complementary symmetrical, said first and third voltage supplies have a positive polarity, and p1 said second voltage supply has a negative polarity.

* * * * *